United States Patent [19]
Holling

[11] Patent Number: 5,349,162
[45] Date of Patent: Sep. 20, 1994

[54] FAULT DETECTION METHOD AND APPARATUS FOR A DOMESTIC APPLIANCE

[75] Inventor: Ronald W. Holling, Lincoln Township, Berrien County, Mich.

[73] Assignee: Whirlpool Corporation, Benton Harbor, Mich.

[21] Appl. No.: 43,949

[22] Filed: Apr. 5, 1993

[51] Int. Cl.⁵ .............................................. H05B 3/00
[52] U.S. Cl. .................................... 219/453; 219/506; 340/825.16; 340/825.36
[58] Field of Search .............. 219/453, 452, 506, 451, 219/509; 340/825.69, 825.72, 825.16, 825.17, 825.36, 539; 341/176; 236/51

[56] References Cited

U.S. PATENT DOCUMENTS

| | | | |
|---|---|---|---|
| 3,461,443 | 8/1969 | Vasel | 340/228 |
| 3,699,300 | 10/1972 | Buerki | 219/10.55 C |
| 3,879,718 | 4/1975 | Roberts | 340/251 |
| 4,421,270 | 12/1983 | Raleigh et al. | 219/505 |
| 4,634,842 | 1/1987 | Payne | 219/506 |

FOREIGN PATENT DOCUMENTS

| | | |
|---|---|---|
| 388727 | 9/1990 | European Pat. Off. . |
| 2506933 | 9/1976 | Fed. Rep. of Germany . |
| 2920189 | 11/1980 | Fed. Rep. of Germany . |
| 3437398 | 4/1986 | Fed. Rep. of Germany . |

Primary Examiner—Bruce A. Reynolds
Assistant Examiner—John A. Jeffery
Attorney, Agent, or Firm—Stephen D. Krefman; Thomas J. Roth; Robert O. Rice

[57] ABSTRACT

A cooking appliance or an electronic control for a cooking appliance and a method of controlling the same including a remote control which has built-in temperature sensor, positional switch and low-battery detection circuit is in two-way intermittent wireless communication with the appliance control unit. The appliance control unit includes a switch means for controlling the heating elements of the cooking appliance wherein the switch means for each heating element includes two power switches connected in series and coupled with a redundancy detection circuit for the detection of a failure of one of the two power switches. Two-way communication between the two control units of the present invention is constantly monitored to ensure proper operation of the cooking appliance and to provide a mechanism to report errors to the user or to shut down the cooking appliance, as appropriate, soon after an error is detected. Mechanisms are also provided whereby the wireless communication means of the control units may be diagnosed to ensure the control unit are properly communicating with each other.

16 Claims, 6 Drawing Sheets

BIT CODING FORMAT OF REMOTE OUTPUT SIGNAL

| START BIT | REMOTE MANUFACTURER IDENTIFIER | REMOTE MODEL IDENTIFIER | MODE CODE | LEFT FRONT & LEFT REAR POWER CODE | RIGHT FRONT & LEFT REAR POWER CODE | CHECKSUM |
|---|---|---|---|---|---|---|
| 1 BIT | 8 BITS | 8 BITS | 8 BITS | 8 BITS | 8 BITS | 8 BITS |

FIG. 4

BIT CODING FORMAT OF REPLY SIGNAL

| START BIT | APPLIANCE MANUFACTURER IDENTIFIER | APPLIANCE MODEL IDENTIFIER | STATUS CODE | CHECKSUM |
|---|---|---|---|---|
| 1 BIT | 8 BITS | 8 BITS | 8 BITS | 8 BITS |

FAULT DETECTION METHOD AND APPARATUS FOR A DOMESTIC APPLIANCE

BACKGROUND OF THE INVENTION

1. Field of the Invention

The present invention relates to the control of a domestic appliance and, in particular, to a remote control system for the control of a cooking appliance.

2. Prior Art

Traditionally, controls for the operation of a cooking appliance such as controls for the heating elements of a cooktop surface as found on an electric range have been located either on the cooktop surface or on a surface which extends vertically from the rear or front of the cooktop surface. Each of these locations have caused problems for either the consumer or the manufacturer.

Selectors, such as buttons or knobs, located on the cooktop surface are susceptible to the collection of dust, food particles and grease thereon and are often subjected to intense heat from the proximately located heating elements. Usually, such cooktop-positioned controls are readily accessible and visible to the operator, but, undesirably, may also be accessible to small children. Furthermore, such controls detract from the space available on the cooktop surface for the heating elements and cause the area around the controls to be difficult to clean.

Many manufacturers of electric ranges place the heating element control selectors on a surface extending vertically from the rear of the cooktop surface. This allows the cooktop surface to be used solely for the heating elements and makes the selectors much less accessible to children. Such selectors are also susceptible to collecting dusts, grease and food particles, but due to their vertical orientation, may be less effected than are cooktop surface positioned controls. However, these rear controls pose additional hazards for the operator as the individual may incur burns or the individual's clothing may be scorched or set on fire when reaching over hot heating elements or over spattering or steaming foods located on tile cooktop in order to adjust the controls. Furthermore, rear controls and displays are difficult for some operators to see and the vertical orientation imposes difficulty for some in interpreting the displays or the position of selectors.

Detached control panels for cooktop surfaces have been developed in which the control panel is installed in a countertop proximate the cooktop surface and communicates via wiring to the cooktop surface. Although detached control panels are easy to see and allow the cooktop surface to be used solely for the heating elements, installation of the detached control panel decreases available countertop surface, is limited by the length of cable provided, and increases the manufacturer's costs by the need to provide a means for routing the cable from inside or underneath the cooktop surface to the detached control panel in a recessed manner. Additionally, should the consumer need to replace the cooktop surface, expensive countertop remodeling may be required to accommodate a new detached control panel of a different size and shape or to accommodate a cooktop surface having integral controls.

The concept of providing a remote control unit for a domestic appliance as is provided for many household electronic devices such as television receivers, VCRs and stereo systems, is very attractive. Not only does a remote control provide the operator with freedom of movement while attending to food being cooked on the heating elements, but many of the disadvantages of cooktop-positioned, rear-positioned, and detached controls are eliminated. Specifically, the controls may be positioned such that they are inaccessible to small children and yet are readily accessible and visible to an adult operator. Remote control also does not require the operator to endanger himself/herself by reaching across hot heating elements or food cooking thereon. Also, remote controls do not require space on the cooktop surface, require less cleaning and are easier to clean by being removed from the proximity of the heating elements, and may be located in a non-hostile environment thereby resulting in greater flexibility for the manufacturer in the selection of materials used for control and display and in reducing the cost of the control.

In addition to the above advantages, remote control heating elements on a cooktop surface requires the provisions of several features not necessary for the remote control of digital electronic devices such as television receivers, VCRs, stereo systems and the like. Because the remote control unit for heating elements on a cooktop surface may be introduced into a hostile environment, specifically the heat generated by the heating elements, it is desirable to provide a means for detecting the hostile environment and for taking precautionary steps after such detection. Also, the status of the heating elements should be constantly monitored to ensure proper operation. This, of course, also requires that the communication link between the remote control and the heating elements be monitored to make certain that nothing interferes with the communication path and to ensure that the proper signals are being transmitted and received by both the remote control and the heating elements.

Remote control of microwave ovens and/or convection ovens is disclosed in U.S. Pat. Nos. 4,816,635 and 4,837,414. These remote control units are similar in operation to commercially available VCR control units which are used to read bar codes containing information about the television channel and program start and end times (or program length) for television programs whereby the VCR is programmed for recording. The controls disclosed in U.S. Pat. Nos. 4,816,635 and 4,837,414 are capable of reading bar codes for particular recipes. The bar code designates the cooking times and power levels for a particular recipe. The bar code information is sent via infrared signals to the computer or control within the main oven unit. The main control unit then interprets those infrared signals and controls cooking times and power levels accordingly. No means is provided for communication from the main unit control to the remote control to ensure proper operation of the microwave oven in a continuous manner, nor is the communication link constantly monitored. Thus, the operator is limited to programming via the remote control.

U.S. Patent No. 4,131,786 discloses a remote control unit which is connected via cables or radio frequency signals to the main control unit for an oven. The remote control unit essentially duplicates the control panel functions of the oven's main control unit. The retention of a fully functional integral control panel together with the implementation of a duplicative remote control unit is one approach to avoiding the need to provide the additional features required for exclusive remote control of an oven; however, this approach, due to redundancy, is expensive to manufacture and defeats many of the advantages obtained by eliminating the need for integral controls, particularly when directed toward control of heating elements on a cooktop surface.

The provision of a remote control unit as the only control unit for heating elements on a cooktop surface is disclosed in European Patent Application No. 90 10 44 85.9 (Publication No. 0 388 727 A2). The remote control unit of this invention, located in the hood above the cooktop surface, communicates via infrared or ultrasonic signals with the heating element controller located on or under the cooktop surface. It is suggested in European Patent Application No. 90 10 44 85.9 that, two-way communication be established between the remote control unit and the heating element controller such that when an object obstructs the communication path, the heating element controller sends a signal to the remote control to inform the operator of the presence of the obstruction. However, this invention does not address the problem of an obstruction which has not been removed, faulty signals between the remote control unit and the heating element controller, proper operation of the heating elements, or the introduction of the remote control unit into a hostile environment.

Thus, it is desirable to provide a remote control system for controlling heating elements of a cooking appliance which detects the introduction of the remote control unit into a hostile environment to thereby prevent damage to the remote control unit and to avoid loss of control of the heating elements.

It is also desirable to provide a remote control system for controlling heating elements of a cooking appliance wherein the operation of the heating elements is constantly monitored.

It is also desirable for such a remote control system which ensures that proper communication is established at all times between the remote control unit and the heating element, controller.

It is also desirable to provide such a remote control system wherein a permanent obstruction in the communication path, faulty signal transmission or receipt, faulty heating elements, or introduction of the remote control unit into a hostile environment results in the proper shut-down of all active heating elements at an appropriate time following the detection of such problem.

SUMMARY OF THE INVENTION

The present invention provides an electronic control for a cooking appliance including a remote control unit adapted to be located remote from the cooking appliance in two-way wireless communication with an appliance control unit located proximate the heating elements of the cooking appliance. Various features are provided in the remote control unit, in the appliance control unit and in the communication between the two units to provide numerous advantages over prior remote control systems for cooking appliances.

The electronic control of the present invention includes a remote temperature sensor which detects the introduction of the remote control unit into a hostile, hot environment to prevent damage to the remote control unit and to avoid loss of control for a predetermined period of time of the heating elements of the cooking appliance should the remote control unit remain in such an environment. The present invention also provides for transmission of signals between the appliance control unit and the remote control unit at specified time intervals and in a specific form so that the integrity of the signals may be constantly monitored and so that errors may be detected with relative expediency. A dual power switching device circuit having a resistor network is utilized within the appliance control unit to reduce the probability that a heating element will be turned on and left uncontrolled. Also, detection of an open heating element, failure in the communication between control units, and other undesirable conditions or errors may result in the activation of an alarm and/or the deactivation of the heating elements. These features are necessary for the provision of a reliable, remotely controlled cooking appliance, but are not found in prior art applications of remote controls to cooking appliances.

Within the remote control unit of the present invention which is adapted to be located remote from the cooking appliance, a remote temperature sensor is provided to prevent the operation of the remote control unit and, hence, the cooking appliance, should the remote control unit enter a hostile or high temperature environment. The remote control unit also includes an automatic shut-off feature initiated by a micro switch or gravity type switch such that when the remote control unit is positioned in a predefined orientation, such as a substantially upright position, the remote control unit is deactivated. The automatic shut-off feature conserves battery power when the remote control unit is stored in such an orientation and also prevents operation of the cooking appliance when the display of the remote control unit is not visible. The remote control unit of the present invention further comprises a means for determining the operative condition of its wireless communication components. When such communication comprises infrared signals and the cooktop surface of the cooking appliance is glass ceramic or infrared reflecting, signals sent from the remote control toward the glass ceramic cooktop are compared to those same signals after they have reflected from the cooktop surface. In this manner, the operative condition of the infrared transmitter and receiver of the remote control is determined.

Within the appliance control unit, the switching mechanism for each heating element of the cooking appliance includes two power switching devices connected in series and coupled with a resistor network. The resistor network comprises a redundancy detection circuit to enhance the probability that a heating element will be turned off should an electronic component failure occur. This circuitry significantly reduces the probability that a heating element will be left on without the ability to control the heating element. Other mechanisms are provided to prevent operation of the heating element should the driver, microprocessor hardware, or microprocessor software of the appliance control unit fail.

With regard to the two-way wireless communication between the remote control unit and the appliance control unit of the present invention, the signals exchanged between the two units each comprise specific bit patterns or signals which help to ensure that the proper remote control unit is used to control a matched appliance control unit. Specifically, the signals from both devices include a start signal and signals identifying the manufacturer and model of the transmitting device. Other bit patterns or signals assist in ensuring that the cooking appliance is operating as commanded by the remote control unit and that errors occurring in the operation of the cooking appliance are transmitted to the remote control unit for display to the user, activation of an alarm and/or deactivation of the heating elements of the cooking appliance. Examples of the types of errors which may be detected include interference of the communication path between the remote control unit and the appliance control unit as may be caused by the presence of a pot handle or the user's own hand.

The present invention also provides a mechanism for determining the operative condition of the wireless transmitter/receivers of both the remote control unit and the appliance control unit. Signals sent from the remote control unit to the appliance control unit are reflected from the appliance cooktop to the remote control unit and compared to the original signal to verify that the communication mechanism of the remote control unit is operating properly. The same process may be used for the appliance control or a known good remote may be used for verification.

The invention, in one form thereof, provides a control for a cooking appliance comprising a control unit adapted to be located remote from the cooking appliance. The control unit includes a sensor for sensing a predefined environmental condition and warning means operatively connected to the sensor for generating a warning signal. The warning means may comprise an audible alarm and/or a visual display, and, in one embodiment, the sensor comprises a temperature sensor and the predefined environmental condition comprises a high temperature condition. In another embodiment thereof, the sensor comprises a gravity switch and the predefined environmental condition comprises a substantially vertical orientation of the control unit. The invention further provides, in one form thereof, a method for controlling a cooking appliance comprising the steps of sensing the predefined environmental condition and generating a warning signal upon the occurrence of the predefined environmental condition.

The invention, in accordance with another embodiment thereof, provides an electronic control for use with a cooking appliance comprising a power supply, switch means operatively connected to the power supply for connecting and disconnecting power from the control unit, and sensor means for sensing a predefined orientation of the control unit. The invention further provides, in one form thereof, a cooking appliance further comprising a processor operatively connected to the sensor means for generating an error or "off" code in the event that the sensor means senses the predefined orientation of the control unit and a transmitter for transmitting an output signal which may include the error code. Furthermore, the cooking appliance comprises a receiver for receiving the output signal from the remote control unit, a transmitter for sending a signal to the remote control unit, a heating element, and an element switch for activating and deactivating the heating element and a microcontroller. The invention further provides a method for controlling a cooking appliance comprising the steps of sensing the predefined orientation of the control unit, generating a warning signal, transmitting an output signal including the error code from the remote control to the appliance control or from the appliance control to the remote control, and deactivating the heating element.

The invention, in accordance with another embodiment thereof, provides a cooking appliance comprising a heating element and an appliance control unit having an element switch operatively connected to the heating element for activating and deactivating the heating element. The element switch includes a first power switching device, a second power switching device connected in series with the first power switching device, and detection means for detecting a failure of one of the first and second power switching devices. In one embodiment thereof, the detection means comprises a resistor network. The invention further provides, in one form thereof, a method for controlling a cooking appliance comprising the steps of detecting a failure of one of the first and second power switching devices and deactivating the heating element. The invention further provides a cooking appliance wherein the appliance control unit further comprises a second processor means operatively connected to the element switch means for generating an error code in the event of the detection of a failure and a second wireless communication means operatively connected to the second processor means for transmitting an appliance error signal including the error code. In addition, the cooking appliance comprises a remote control unit adapted to be located remote from the cooking appliance. The remote control unit includes a first wireless communication means for receiving the appliance error signal and a warning means operatively connected to the first wireless communication means for generating a warning signal. The invention further provides a method for controlling a cooking appliance comprising the steps of detecting a failure of one of the first and second power switching devices, deactivating the heating element, generating the error code, transmitting the appliance error signal including the error code with the second wireless communication means, receiving the appliance error signal with the first wireless communication means, and generating a warning signal.

The invention, in accordance with another embodiment thereof, provides a cooking appliance or an electronic control for use with a cooking appliance comprising a remote control unit and an appliance control unit. The remote control unit, adapted to be located remote from the cooking appliance, includes selection means for selecting the operational parameters of the cooking appliance and for generating selection signals, processing means for processing such selection signals into a plurality of output signals, and first wireless communication means for sending output signals and for receiving reply signals. The appliance control unit includes means for generating the reply signals, a second wireless communication means operatively connected to the means for generating reply signals for receiving the output signals and for sending reply signals, and switch means operatively connected to the second wireless communication means for controlling the cooking appliance. Both the output signals and the reply signals include a start signal, a signal identifying the manufacturer of the respective transmitting device, and a signal identifying the model of the transmitting device. The invention further provides a method for controlling a cooking appliance comprising the steps of selecting the operational parameters of the cooking appliance, processing those selections into a plurality of output signals, transmitting the output signals from the first wireless communication means, receiving the output signals at the second wireless communication means, generating the reply signals, transmitting the reply signals from the second wireless communication means, and receiving the reply signals with the first wireless communication means.

The invention, in accordance with another embodiment thereof, provides an electronic control for use with a cooking appliance comprising a remote control unit adapted to be located remote from the cooking appliance and an appliance control unit. The remote control unit includes means for repetitively generating an output signal at predefined time intervals, a first wireless communication means for sending the output signals and for receiving reply signals, and timing means for timing the period between the receipt by first wireless communication means of successive reply signals. The appliance control unit includes means for generating the reply signal within predefined time intervals in response to the repetitive output signal, a second wireless communication means operatively connected to the reply signal generating means for both receiving the output signals and for sending the reply signals, and switch means for controlling the cooking appliance wherein the switch means is operatively connected to the second wireless communication means. The invention further provides, in one form thereof, a method for controlling a cooking appliance comprising the steps of generating the output signal after the passage of each predefined time interval, transmitting the output signal with the first wireless communication means, receiving the output signal at the second wireless communication means, generating the reply signal in response to the output signal, transmitting the reply signal with the second wireless communication means, receiving the reply signals at the first wireless communication means, and measuring the time period between the transmission of the output signal and the receipt of the reply signals.

The invention, in accordance with another embodiment thereof, provides an electronic control for use with a cooking appliance comprising a remote control unit and an appliance control unit. The remote control unit, adapted to be located remote from the cooking appliance, includes a means for generating output signals including the operative parameters of the cooking appliance, a first wireless communication means for transmitting the output signals and for receiving reply signals, and an error detection means for determining an error in the reply signals. The appliance control unit includes a means for generating reply signals and for setting an error code within the reply signals and a second wireless communication means operatively connected to the reply signal generating means for transmitting the reply signals in response to the receipt of the output signals. The invention further provides a method of controlling a cooking appliance comprising the steps of generating the output signals, transmitting the output signals from the first wireless communication means, receiving the output signals at the second wireless communication means, generating reply signals including an error code, transmitting the reply signals with the second wireless communication means, receiving the reply signals at the first communication means, and detecting the presence of the error code in the reply signals. In another form thereof, the control unit further comprises a warning means to provide a warning signal to a user in the event the error code is detected in the reply signals. In yet another form thereof, the appliance control unit comprises a switch means and the cooking appliance further comprises a heating element operatively connected to the element switch means, and the output signal generated by the output signal generating means include a selectable parameter instructing the switch means to deactivated the heating element whereby, upon the detection of an error code in the reply signal, an output signal including the selectable parameter is generated, transmitted from the first wireless communication means, and received by the second wireless communication means. The heating element is then deactivated by the switch means. Also, when the appliance control detects a continuous error in the remote transmission, the cooktop control will turn off all heating elements.

The invention, in accordance with another embodiment thereof, provides a cooking appliance having a glass ceramic cooktop and a control unit adapted to be located remote from the cooking appliance. The control unit includes a means for generating output signals, an infrared communications means for sending the output signals and receiving reflected signals and a processor means for comparing the output signals to the reflected signals. The reflected signals comprise output signals which have reflected from the cooktop to the infrared communication means. The invention further provides, in one form thereof, a method for controlling a cooking appliance comprising the steps of generating output signals, transmitting the output signals, receiving the reflected signals, and comparing the output signals to the reflected signals.

The invention, in accordance with another embodiment thereof, provides an electronic control for use with a cooking appliance comprising a remote control unit adapted to be located remote from the cooking appliance, wherein the remote control unit includes a means for generating output signals, first wireless communication means for sending the output signals and for receiving reply signals, and processor means for comparing the output signals to the reply signals. In addition, the electronic control comprises an appliance control unit including means for generating the reply signals and a second wireless communication means for sending the reply signals and for receiving output signals. The invention further provides a method for controlling a cooking appliance comprising the steps of generating the output signals, transmitting the output signals with the first communication means, receiving the output signals with the second wireless communication means, generating the reply signals, transmitting the reply signals with the second wireless communication means, receiving the reply signals with the first wireless communication means, and comparing the reply signals to the output signals.

Accordingly, one advantage of the present invention is that the remote control unit used for controlling a cooking appliance includes an automatic shut-off feature which extends the life of the batteries used to power the remote control and prevents the operation of the remote control unit and the cooking appliance should the remote control unit's display and/or selectors not be visible to a user. Battery life is also conserved by turning off unnecessary circuitry, such as the remote receiver and placing the microcomputer in a "sleep mode" between transmissions.

Another advantage of the present invention is the provision of a remote control unit for use with a cooking appliance which is able to detect when the remote control has entered an undesirable, hostile environment to prevent damage to the remote control unit and to avoid the uncontrolled operation of the cooking appliance for a predetermined period of time such as thirty (30) seconds max. should the remote control unit fail to properly operate within such an environment.

Still another advantage of the present invention is the provision of an infrared remote control unit for use with a cooking appliance having a glass ceramic cooktop surface which is self-diagnosing with regard to the functionality of its transmitting and receiving capabilities.

Yet another advantage of the present invention is the provision of an appliance control unit for controlling the heating elements of a cooking appliance which detects failures of the power switching devices of the switching circuitry to avoid the situation in which such a failure leaves a heating element turned on without a means to turn it off.

Another advantage of the present invention is that the remote control unit and appliance control unit communicate intermittently and in a specific form so that the life of the batteries powering the remote control are extended and so that the integrity of the signals communicated may be constantly monitored.

Still another advantage of the present invention is the provision of a remote control unit and an appliance control unit which are self-diagnosing with regard to the communication means of each control unit used for transmitting and receiving signals to determine whether proper communication between the devices is occurring.

Yet another advantage of the present invention is the detection of errors in the operation of the remote control unit, the appliance control unit and the cooking appliance and the ability to take appropriate action with expediency. A warning signal, such as an audible alarm and/or a message on a visual display, may be generated in the event of an error occurring, and/or the heating elements of the cooking appliance may be deactivated.

BRIEF DESCRIPTION OF THE DRAWINGS

The above-mentioned and other features and advantages of this invention, and the manner of attaining them, will become more apparent and the invention will be better understood by reference to the following description of the embodiments of the invention taken in conjunction with the accompanying drawings, wherein.

Corresponding reference characters indicate corresponding parts throughout the several views. The exemplifications set out herein illustrates one preferred embodiment of the invention, in one form, and such exemplifications are not to be construed as limiting the scope of the invention in any manner.

DETAILED DESCRIPTION OF THE INVENTION

Figure 1:
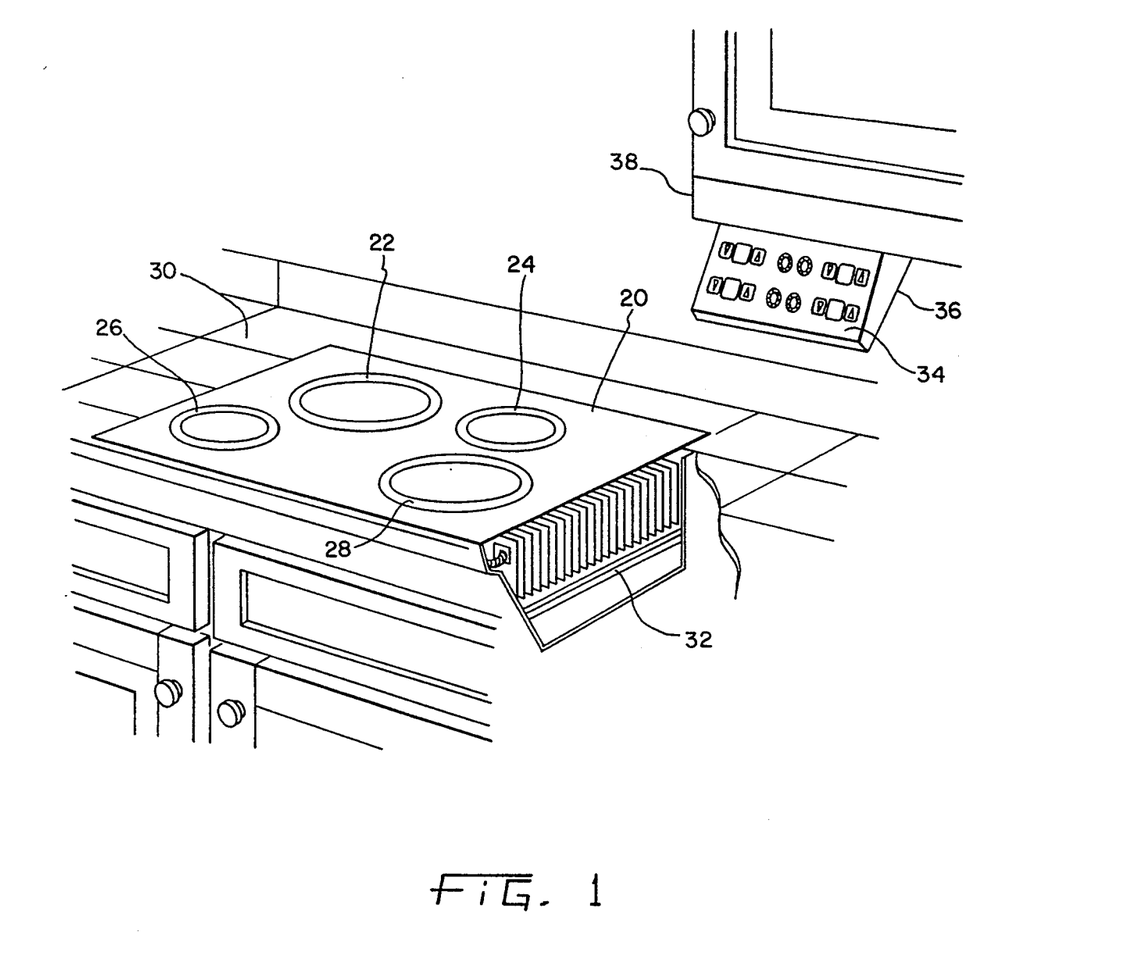
FIG. 1 is a perspective view of one embodiment of the cooking appliance and remote control unit of the present invention.

Referring now to the drawings and particularly to FIG. 1, there is shown a perspective view of one embodiment of the remote control unit and cooking appliance according to the present invention. In this embodiment, glass ceramic cooktop surface 20 having first, second, third and fourth heating elements 22, 24, 26 and 28, respectively, is disposed within a cutout in countertop 30. Located beneath cooktop surface 20 is appliance control unit 32 which includes switch means (see FIG. 6) operatively connected to heating elements 22, 24, 26 and 28 to control the cooking appliance, and, more particularly, to energize, control the power levels, and de-energize heating elements 22, 24, 26 and 28.

In this embodiment, remote control unit 34, which communicates via wireless communication means with appliance control unit 32 and which is adapted to be located remote from cooktop 20 of the cooking appliance, rests on bracket 36 which is affixed to overhead cabinet 38. The provision of bracket 36 allows remote control unit 34 to be stored out of the reach of children when remote control unit 34 is not in use. Furthermore, an automatic shutoff feature discussed herein, may be incorporated in remote control unit 34 such that under certain conditions it may command appliance control unit 32 to shut off all heating elements 22, 24, 26 and 28 and the power to remote control unit 34 may be disconnected.

It will be appreciated that the cooking appliance of the present invention need not be limited to a cooktop surface installed within a countertop as illustrated in FIG. 1. Appliance control unit 32 and remote control unit 34 may also be used to control the heating elements found on an electric range or the heating element of an electric oven. It will also be appreciated that various types of wireless communication between remote control unit 34 and appliance control unit 32 may be employed. The use of an infrared beam as the communication means is consistent with the provision of a glass ceramic cooktop surface as illustrated in FIG. 1. However, ultrasonic or radio frequency communication means may also be utilized.

Figure 2:
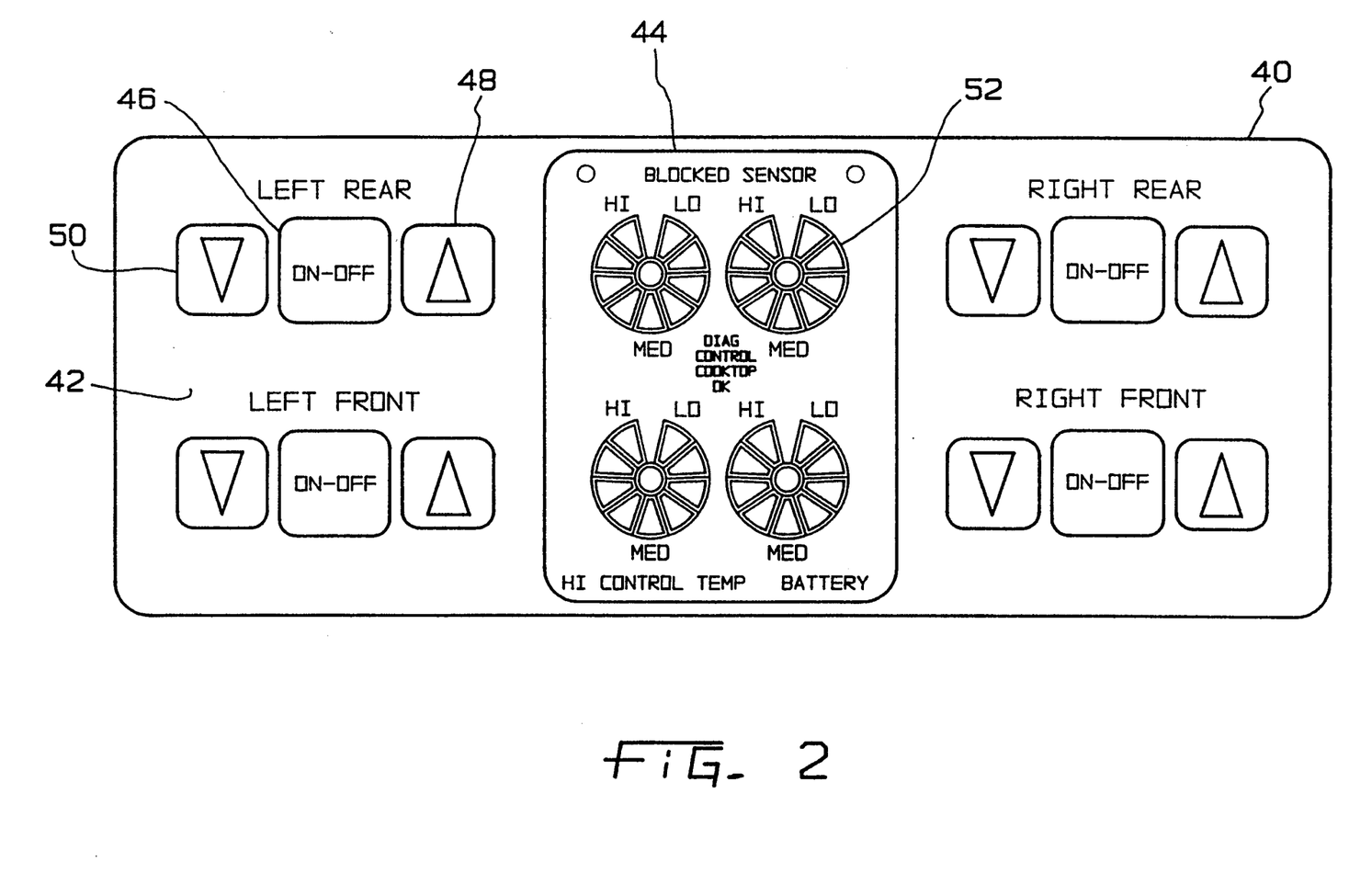
FIG. 2 is a top view of one embodiment of the input and display means of the remote control unit as shown in FIG. 1.

FIG. 2 shows a top view of one embodiment of the input and display means of the remote control unit as shown in FIG. 1. Control panel 40 includes membrane keyboard 42 having LCD display 44 centered thereon. In this embodiment, membrane keyboard 42, a selection means for selecting the operational parameters of the cooking appliance, including power levels for each heating element, and for generating selection signals containing such operational parameters, comprises four sets of similar keys, one set for each heating element of the cooking appliance. The labels LEFT REAR, RIGHT REAR, LEFT FRONT, and RIGHT FRONT correspond to first, second, third and fourth heating elements 22, 24, 26 and 28, respectively, as shown in FIG. 1. For the LEFT REAR or first heating element 22, depression of on-off key 46 enables the use of the power level keys 48 and 50. If key 48 or 50 is pressed within ten seconds after pressing the on/off key 46, key 46 switches the power on and off to first heating element 22. When power to first heating element 22 is on, depressing power level increase key 48 increases the amount of power applied to first heating element 22 and depressing power level decrease key 50 decreases the amount of power applied to first heating element 22. Disposed on LCD display 44 is first burner display 52 which provides information to the user regarding the power level applied to first heating element 22. Should no power be applied to first heating element 22, first burner display 52 will not provide power level information. As power level increase key 48 is depressed, pie-shaped sections of first burner display 52 are lit, beginning at the label LO, moving clockwise through the label MED, to the label HI. In this embodiment, nine (9) power levels may be set for first heating element 22. In this manner, the user may ascertain the power level applied to first heating element 22 according to the selections made through the selection membrane keyboard 42 of remote control panel 40. It will be appreciated by those skilled in the art that similar selection means or keys are provided for each heating element of the cooking appliance of the present invention and that all operate in a similar manner.

In addition to burner displays such as first burner display 52, messages regarding the operating condition of the cooking appliance may be displayed on LCD display 44. Illustrated in FIG. 2 are four messages: BLOCKED SENSOR, DIAG CONTROL COOKTOP OK, HI CONTROL TEMP, and BATTERY. Each of these messages is explained in greater detail hereinbelow.

It will be appreciated that the input and display means of the present invention need not be limited to membrane keyboard 42 and LCD display 44 as illustrated in FIG. 2, although the advantages of the embodiment of FIG. 2 are evident in that the surface of remote control panel 40 is easy to clean, easy to use and is comprised of reliable components. Furthermore, LCD display 44 consumes little battery power. For example, dials such as those traditionally employed on electric ranges or cooktops may be utilized to allow the user to set the desired power levels of heating elements 22, 24, 26 and 28. Also, the position of such dials or, alternatively, an array of LEDs may be utilized to indicate the actual power level of heating elements 22, 24, 26, and 28 or to provide information to the user in terms of the operating condition of the cooking appliance.

Figure 3:
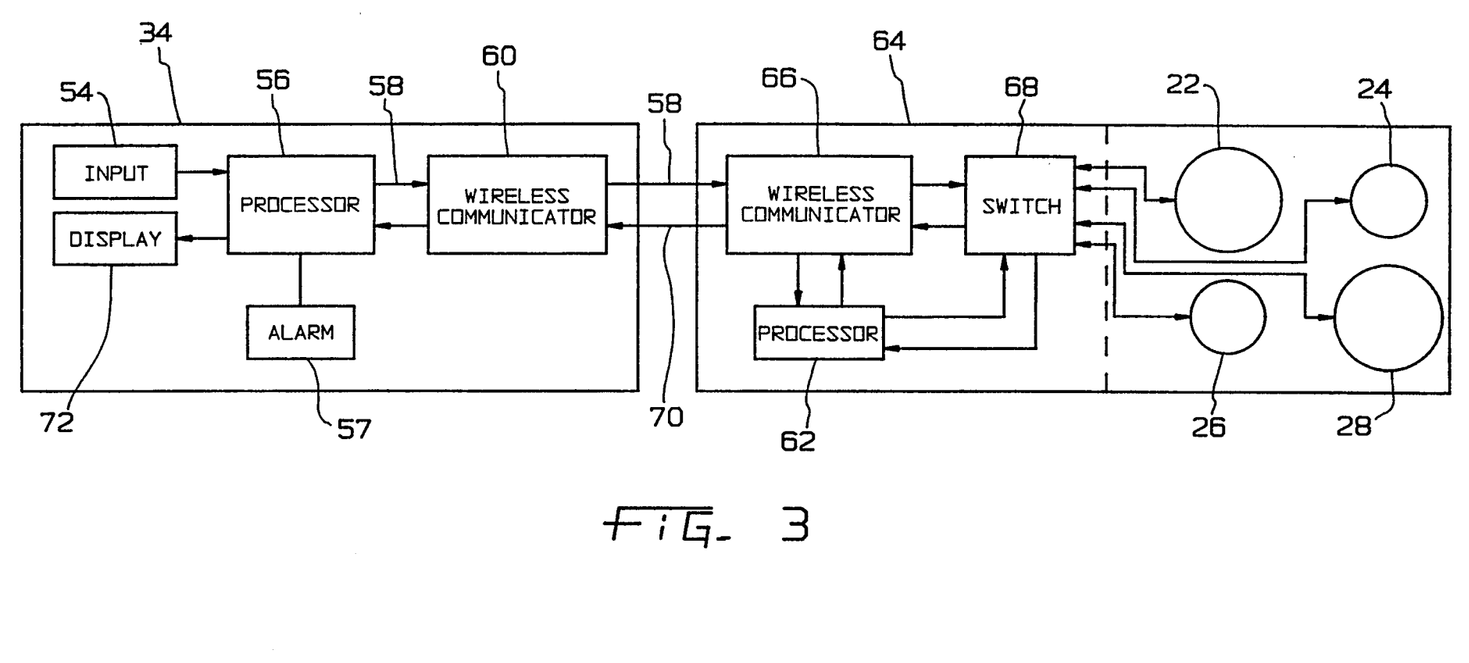
FIG. 3 is a block diagram of the remote control unit and cooking appliance of the present invention.
Figure 4:
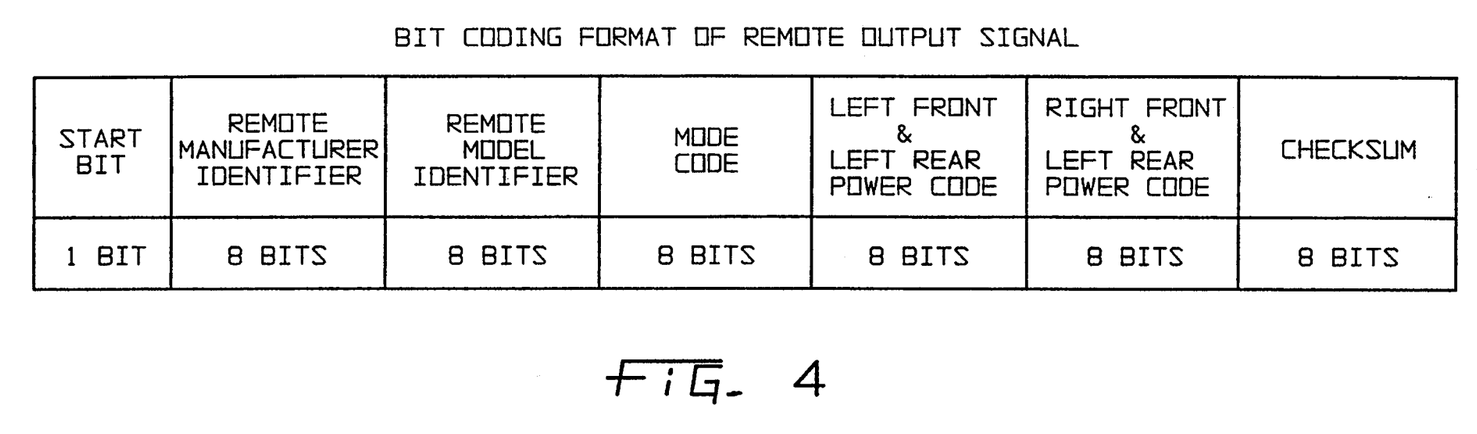
FIG. 4 is a table illustrating one embodiment of the bit coding format of the remote output signal transmitted from the remote control unit to the appliance control unit.

Referring now to FIG. 3, there is shown a block diagram of the remote control unit and cooking appliance of the present invention. Remote control unit 34 includes input selection means 54, such as membrane keyboard 42 of the embodiment of FIG. 2, for selecting the operational parameters of the cooking appliance and for generating selection signals. Selections received by selection means 54 are provided to processor 56 which, in turn, processes such selections into a plurality of output signals 58 including a start signal, a signal identifying the manufacturer of remote control unit 34 and a signal identifying the model of remote control unit 34. Output signals 58, one embodiment of which is shown in FIG. 4, may also include a signal identifying the mode of remote control unit 34 such as command mode, wherein remote control unit 34 is set to command a change in the desired power level of one or more heating elements of the cooking appliance, or a diagnostic mode wherein a diagnostic test, such as is discussed hereinbelow, is to be performed by remote control unit 34. Furthermore, remote output signals 58 may include a signal representing the desired power level of one or more heating elements and a first checksum signal.

Output signals 58 are transmitted by first wireless communication means 60 to processor 62 of appliance control unit 64. Processor 62 includes second wireless communication means 66 for sending and receiving signals, including the receipt of remote output signals 58 from remote control unit 34. Operatively connected to processor 62 is switch means 68 which is in turn connected to first, second, third and fourth heating elements 22, 24, 26 and 28, respectively. Switch means 68 controls, i.e., activates to a particular power level and deactivates, heating elements 22, 24, 26 and 28 based on output signals 58 received from remote control unit 34 via second wireless communication means 66 of processor 62.

Figure 5:
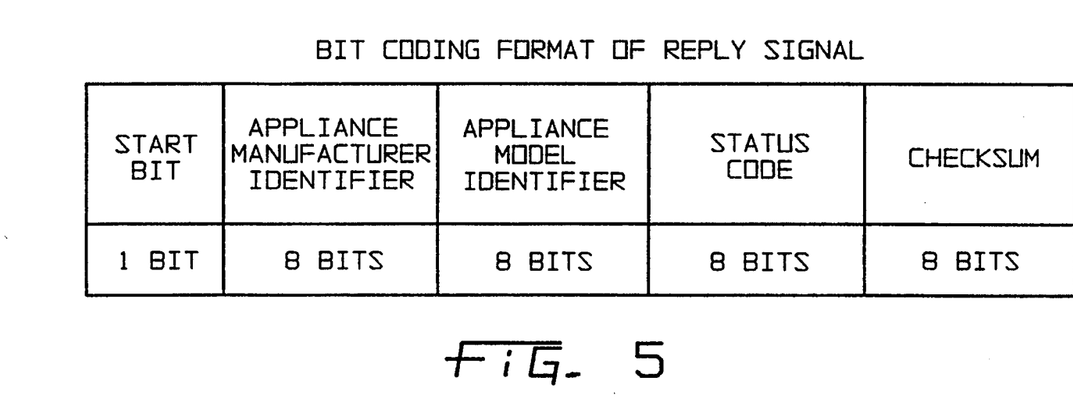
FIG. 5 is a table illustrating one embodiment of the bit coding format of the reply signal transmitted from the appliance control unit to the remote control unit in response to the remote output signal of FIG. 4.

According to the present invention, appliance control unit 64 is also operable in a reply mode wherein in response to the receipt of remote output signals 58, appliance control unit 64 via processor 62 provides a reply to remote control unit 34 via reply signals 70. Thus, processor 62 serves as a means for generating reply signals 70. Reply signals 70 include a start signal, a signal identifying the manufacturer of the cooking appliance and a signal identifying the model of the cooking appliance. Reply signals 70, one embodiment of which is shown in FIG. 5, may also include a signal representing the status of operation, such as associated with a cooking mode or diagnostic mode, of the cooking appliance as well as a second checksum signal.

During operation of the cooking appliance according to the present invention, remote output signals 58 are transmitted from first wireless communication means 60 of remote control unit 34 to second wireless communication means 66 of processor 62 of appliance control unit 64. Reply signals 70 are then generated by processor 62 of appliance control unit 64 in response to receipt of remote output signals 58. Reply signals 70 indicate the operating condition of the cooking appliance such as the mode of operation of the cooking appliance and whether or not the cooking appliance is operating properly. After being generated, reply signals 70 are transmitted to first communications means 60 of remote control unit 34 by second wireless communication means 66 of appliance control unit 64. Thereafter, remote signals 70 may be sent to processing means 56 and if, for example, an error is detected, a message may be sent to display means 72 such as LCD display 44 of the embodiment of FIG. 2. In addition to providing a warning signal such as a message on display means 72 or the activation of alarm BEEPER (see FIG. 7), heating elements 22, 24, 26 and 28 may be deactivated. Deactivation may be performed as directed by appliance control unit 64 or through the provision of output signal 58 from remote control unit 34 to appliance control unit 64 containing an instruction to deactivate heating elements 22, 24, 26 and 28 as discussed herein.

It will be appreciated that the electronic remote control of the present invention provides many advantages to the consumer. Not only may a user operate the cooking appliance from a remote location, but the remote control unit may be kept out of the reach of children and away from hot heating elements or splattering or steaming foods cooking thereon. From the manufacturer's perspective, greater flexibility results in the selection of materials used for the remote control unit as the unit need not reside in a hostile, potentially high temperature, environment. It will also be appreciated that the provision of two-way communication between remote control unit 34 and appliance control unit 64 provides a vehicle for the provision of various features not found in many remotely controlled electronic devices. For example, by transmitting the manufacturer and model of remote control unit 34 to appliance control unit 64 and by transmitting the manufacturer and model of the cooking appliance from appliance control unit 64 to remote control unit 34, one may be certain that the appropriate remote control unit is used with the appropriate, matched cooking appliance.

Referring now to FIG. 4, there is shown a table illustrating one embodiment of the bit coding format for the remote output signal. In this embodiment, the selected power levels for all four heating elements are sent in two packets of eight (8) bits each, the first four (4) bits of which represent the power levels selected for a front heating element and the last four (4) bits of which represent the power levels selected for a rear heating element. The first checksum is the complement of the sum of the Mode Code, Left Front and Left Rear Power Code and the Right Front and Right Rear Power Code.

FIG. 5 shows a table illustrating one embodiment of the bit coding format of the reply signal transmitted from the appliance control unit to the remote control unit in response to the remote output signal of FIG. 4. In this embodiment, the eight (8) bits of the Status Code are comprised of four (4) bits comprising an error code used to indicate whether or not the four (4) heating elements are operating properly and four (4) bits which provide an appliance error indicating whether the cooking appliance is working without error, the validity of the output signals received by appliance control unit 64 or other related error detection. The second checksum is the complement of the Status Code in this embodiment.

In one embodiment of the present invention, upon depression of a key on remote control panel 40 as shown in FIG. 2, output signals 58 are transmitted intermittently to appliance control unit 64. Intermittent transmission is preferred to limit the amount of power required from such transmission. This is particularly important in view of the fact that remote control unit 34 is powered by batteries (see FIG. 7), and, therefore, battery life is extended when intermittent rather than continuous transmission is utilized. Similarly, remote control unit 34 is poised to receive reply signals 70 generated and transmitted by appliance control unit 64 intermittently as well. A time interval of 2 seconds is considered appropriate for such intermittent transmissions.

It will be appreciated that the actual codes or bit patterns used to represent the data transmitted and received by remote control unit 34 as illustrated in FIGS. 4-5 are a matter design choice. For example, four (4) bits may be utilized to represent 16 available power levels for a particular heating element, or four (4) bits may be utilized but are limited to the binary value 1001 representing only nine (9) available power levels as illustrated in FIGS. 1-2.

During wireless communication, the potential exists for the communication path between remote control unit 34 and appliance control unit 64 to be interrupted or for the signals therebetween to become corrupted. Interruption of the communication may be caused by the presence of the user or some object, for example in the communication path between transmitter and receiver. Improper operation of the system or interference caused by another wireless device using the same frequency may corrupt the signal. Thus, it is desirable for the system, including remote control unit 34 and appliance control unit 64, to constantly monitor the integrity of such signals and to ensure that signals are being transmitted and received as expected.

With regard to interruption of the communication patch between remote control unit 34 and appliance control unit. 64, in one embodiment of the present invention, processor 56 serves as a means for repetitively generating output signal 58 at predefined time intervals such as every two (2) seconds. Processor 62 serves as a means for repetitively generating reply signal 70 at predefined time intervals in response to output signal 58. Processor 56 of remote control unit 34 serves as a timing means for timing the time period between the receipt by first wireless communication means 60 of successive reply signals 70. During operation, output signal 58 is generated by processor 56 after the passage of each predefined time interval and is transmitted by first wireless communication means 60. Receiving output signal 58 at second wireless communication means 66, processor 62 of appliance control unit 64 generates reply signal 70 in response to output signal 58. Reply signal 70 is transmitted from second wireless communication means 66 and reply signal 70 is received at first wireless communication means 60. Timing means or processor 56 then measures the time period between the transmission of output signals 58 from first wireless communication means 60 and the receipt of reply signals 70 at first wireless communication means 60. Should the time measured by processor 56 exceed a predefined value, such as five (5) seconds (average) for a two (2) second intermittent time interval, alarm BEEPER (see FIG. 7) may be sounded to provide the user with a warning signal. Another method of testing is to test for a predetermined number e.g. three (3) of consecutive error free transmissions. The predefined value should be such that it permits for the occasional momentary obstruction as may be caused by a hand or an arm passing through the communication path without activating a warning means, such as alarm BEEPER, to generate a warning signal. The provision of a warning signal permits the user to rectify the situation, i.e., to remove the object which is obstructing the communication path between remote control unit 34 and appliance control unit 64. In addition, or as an alternative, to sounding alarm BEEPER, a warning message may be displayed with display means 72 of remote control unit 34. Referring to FIG. 2, the message BLOCKED SENSOR serves this purpose.

Corruption of either output signals 58 or reply signals 70 should have a similar result to an obstruction or interruption of the communication path. As discussed above, reply signal 70 includes a Status Code wherein one or more bits may provide an indication to remote control unit 34 that output signals 58 received by appliance control unit 64 are faulty or corrupt. Such a determination may be made by comparing the value of the checksum portion of output signals 58 to the complement of the sum of the Mode Code, Left front and Left Rear Power Code and the Right Front and Right Rear Power Code of output signal 58. If unequal, output signals 58 are corrupt. Corruption may also be determined should part of the signal not be transmitted or should the values of the signal be out of range. Similarly, corruption of reply signal 70 may be determined by processing means 56 of remote control unit 34. In the event that an error occurs, and is present for a predetermined period of time, such as 30 seconds, switch means 68 of appliance control unit 64 is commanded by either remote control unit 34 or appliance control unit 64 to de-energize heating elements 22, 24, 26 and 28 of the cooking appliance. Specifically, processor 56 generates output signals 58 including selections which indicate the power levels to which heating elements 22, 24, 26 and 28 are to be deactivated. Such output signals 58 are transmitted by first wireless communication means 60 to second wireless communication means 66 whereupon switch means 68 deactivates all heating elements 22, 24, 26 and 28. Alternately, processor 62 may include means for timing the receipt of successive output signals 58. Should a predefined amount of time, such as thirty (30) seconds, be exceeded between the receipt of successive output signals 58, processor 62 may instruct switch means 68 to deactivate all heating elements 22, 24, 26 and 28.

It will be appreciated that any other error condition as may be communicated via reply signal 70 or detected by remote control unit 34 may result in switch means 68 de-energizing heating elements 22, 24, 26 and 28. Processor 62 generates reply signals 70 having an error code. When reply signals 70 are received by first wireless communication means 60 and an error in reply signals 70 is detected by processor 56, processor 56 may generate output signals 58 including selections for deactivating heating elements 22, 24, 26 and 28. Such output signals 58 are transmitted from first wireless communication means 60 and received by second wireless communication means 66. Switch means 68 then deactivates heating elements 22, 24, 26 and 28 according to the selections contained in output signals 58. Also, an alarm may be sounded should the error be one which deserves the use's attention or which the user may be able to resolve. In addition, remote control unit 34 may display with display means 72, as appropriate, the detected error.

Remote control unit 34 of the present invention also provides a means for determining the operative condition of first wireless communication means 60 when the type of wireless communication used is infrared and when cooktop surface 20, such as shown in FIG. 1, is glass ceramic or infrared reflective. Specifically, processing means 56 of remote control unit 34 compares output signals 58 transmitted by first wireless communication means 60 to signals transmitted by first wireless communication means 60, reflected from glass ceramic cooktop surface 20 and received by first wireless communication means 60. Output and reflected signals may be compared in totality for a match of all elements of each signal, or, when a checksum is included in such a signal, the checksums alone of the respective signals may be compared. In this manner, the operative condition of first infrared communication means 60 may be determined by remote control unit 34. Thus, the method used to diagnose the operative condition of first infrared communication means 60 requires generating output signals 58, transmitting output signals 58, receiving reflected signals reflected from glass ceramic cooktop 20, and comparing output signals 58 to reflected signals to determine the operative condition of infrared communication means 60.

Similarly, the operative condition of first and second wireless communication means 60 and 66 respectively, may be determined by the electronic control of the present invention. In this instance, output signals 58 generated by processor 56, are transmitted from first wireless communication means 60 to second wireless communication means 66 and reply signals 57 are then generated by processor 62. Reply signals 70 are transmitted from second wireless communication means 66 to first wireless communication means 60. Processor means 56 compares output signals to reply signals 70 or the respective checksums of each to determine whether both first and second wireless communication means, 60 and 66, are operating properly.

It will be appreciated that should infrared communication be utilized and if the results of the first diagnostic test for testing the operating condition of first wireless communication means are favorable, and if the results of the second diagnostic test are unfavorable, it is most likely that second wireless communications means 66 is not operating properly. It will be further appreciated that the user may be informed of the results of both diagnostic tests as is illustrated in FIG. 2 by the messages DIAG, CONTROL, COOKTOP and OK found in the center of LCD display 44. If, for example, the first and second diagnostic tests are performed upon initiation of remote control unit 34, in that order, if the results of the first diagnostic test are favorable, the total message DIAG CONTROL OK is displayed. Similarly, should the results of the second diagnostic test be favorable, the total message DIAG COOKTOP OK is displayed. Should the results of the first diagnostic test be unfavorable the message DIAG CONTROL is flashed with a 50% duty cycle with a one (1) second period and the second diagnostic test is not performed.

Figure 6:
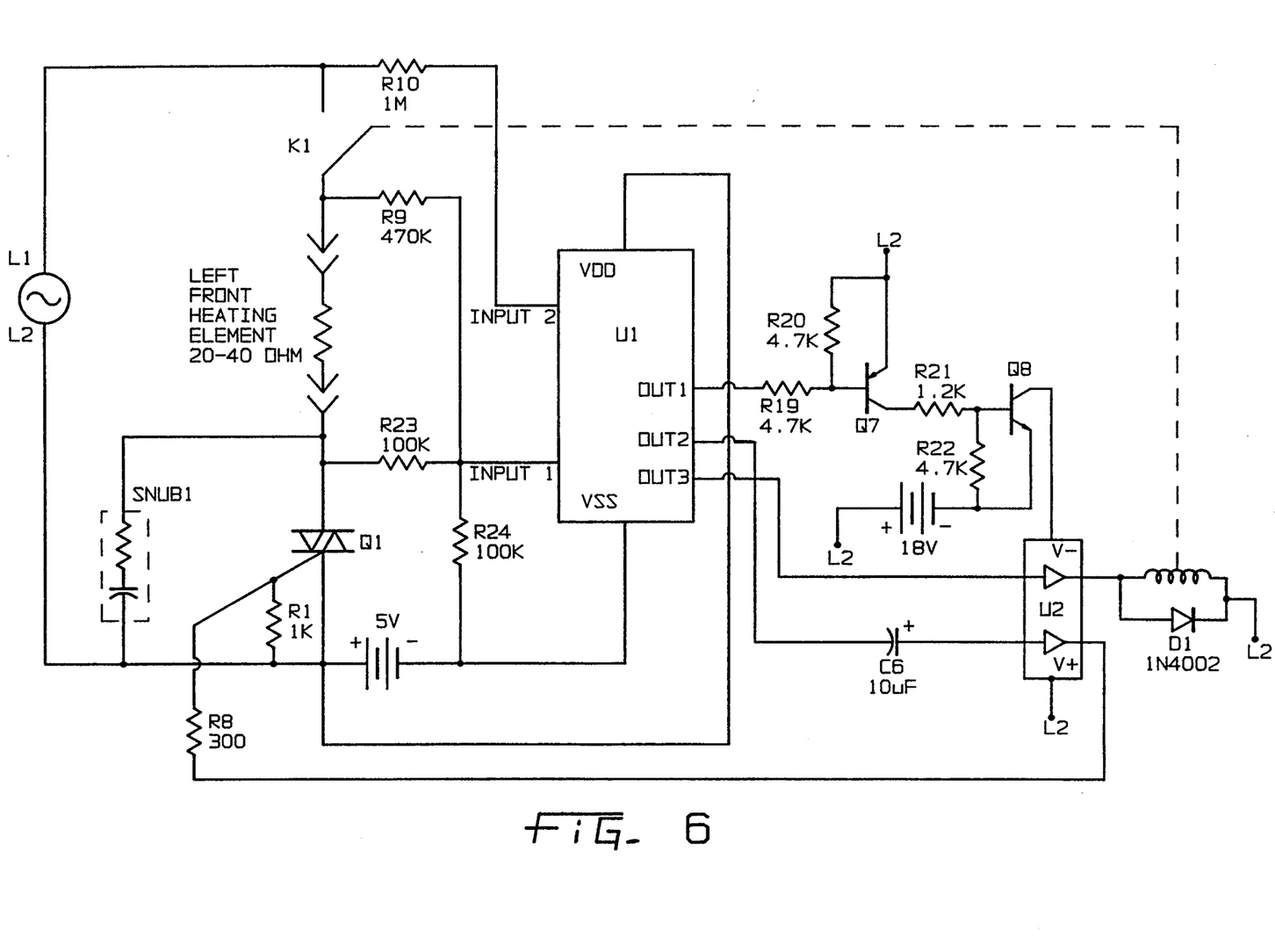
FIG. 6 is a schematic diagram of one embodiment of the circuitry resident in the appliance control unit of the present invention for the left front heating element of a cooking appliance.

Referring now to FIG. 6, there is shown a schematic diagram of the circuitry resident in the appliance control unit of the present invention for the left front heating element of a cooking appliance. This circuit provides a means for detecting the occurrence of a component failure within the circuit so that the activation of the heating element may be prevented in the event of such a failure. In this embodiment, first and second power switching devices, triac Q1 and single pole relay K1, respectively, are in series thereby requiring both triac Q1 and relay K1 to be "on" to activate the heating element. Resistor network R9, R23 and R24 comprise a redundancy detection circuit which enhances the probability that the heating element will be turned off should a failure occur, and decreases the probability that a heating element will be left on or powered with no means to control the heating element. Specifically, failure of the first and second power switching devices, Q1 and K1, as detected by detection means or resistor network R9, R23 and R24, results in deactivation of the left front heating element via the element switch means circuitry comprising first and second power switching devices, Q1 and K1, and resistor network R9, R23 and R24. If relay K1 is shorted, resistor R9 and parallel connected resistor R23 form a voltage divider with resistor R24 to thereby reduce the signal to a level which is compatible with microprocessor U1. During the negative half-line cycle, detection is not possible as the input to microprocessor U1 is negative. To prevent damage to microprocessor U1 during the negative half-line cycle, microprocessor U1 has internal diode clamping to Vss. However, when the line becomes positive, a sinusoidal signal is applied to INPUT 1 of microprocessor U1 which also has internal diode clamping VDD to prevent excessive positive voltages from damaging input to microprocessor U1. Because input INPUT 1 is only acted upon during the "off" time of the heating element, such a sinusoidal condition during the "off" time of the heating element is detection of an inconsistent condition for relay K1's contacts versus the coil status prevents triac Q1 and relay K from being turned on.

If triac Q1 is shorted, resistor R23 forms a voltage divider with resistor R24. Because triac Q1 must be referenced to the line, snubber SNUB1 is also in the detection loop. Placing snubber SNUB1 across triac Q1 does not interfere with the intended functionality of the circuitry as it does not pass direct current. Placing such a snubber across relay K1, however, could cause problems as there may appear to be a defective relay due to the AC signal passed by the snubber. A positive input is always present at input INPUT 1 of microprocessor U1 when triac Q1 is conducting, regardless of whether the line is positive or negative, as the 5 volt supply serves as the excitation signal in this case. Thus, if triac Q1 is shorted, the resistor divider network divides the 5 volt supply by two and applies it to input INPUT 2 of microprocessor U1 representing a "high" condition at INPUT 2, signifying a failure has been detected.

In this embodiment, eight channel driver U2 is used to drive four (4) relays and four (4) triacs as may be required for a total of four (4) heating elements. Use of driver U2 assists in minimizing the manufacturer's cost of the system, however, its use introduces the possibility that a triac or relay for particular heating element could be turned "on" if the appropriate outputs of driver U2 were shorted low. To address this problem, a second driver, Q7 and Q8 combined, supplies driver U2 with the unregulated voltage necessary for operation and output OUT1 of microprocessor U1 enables driver U2 when an element is required to be turned "on."

To minimize the cost of the required DC power supply, pulsing of triac Q1 and relay K1 coils is employed in this embodiment. When triac Q1 is to be turned on, a 250 microsecond voltage pulse is applied to the gate of triac Q1 via a line zero-cross provided by resistor R10. The drive pulse is provided by output OUT3 of microprocessor U1 and is level shifted by drive U2. Similarly, a drive pulse active for 1.25 ms and off for 0.75 ms is provided by output OUT 2 of microprocessor U1 and applied to relay K1 coil via driver U2 when relay K1 is to be turned on. The on and off times of relay K1 are chosen provide an RMS value to relay K1 coil which is equal to the coil DC voltage rating. Diode D1 across relay K1 coil prevents the contact of relay K1 from opening during the off time of the applied signal.

In addition to the protection provided by the circuitry of FIG. 6, a watch dog timer as is well known in the art is run on microprocessor U1 to prevent an unintended software loop from applying the pulsed signal to the driver lines.

Should resistor network R9, R23, R24 detect a failure in one of the first and second power switching devices, Q1 and K1, second processor means, processor U1, operatively connected to resistor network R9, R23 and R24 generates an error code which is transmitted as a portion of an appliance error signal via second wireless communication means 66 (see FIG. 3) to first wireless communication means 60 of remote control unit 34. The appliance control disables both power switching drivers if a triac or relay is shorted. Therefore if the LF circuitry is defective, the LF element will be disabled. This happens independently of the remote in the normal operating mode. Upon receipt of an appliance error signal containing the error code, a warning may be generated with either alarm BEEPER (see FIG. 7) or through display of a message on display 72 of remote control unit 34.

It will be appreciated that most of the circuitry of FIG. 6 may be repeated for a cooking appliance having more than one heating element. Because driver U2 supports four (4) heating elements, it need not be repeated. Similarly, the same microprocessor U1, voltage regulator, and voltage supplies may be shared by more than one heating element.

It will also be appreciated that the circuitry illustrated in FIG. 6 provides a cost effective control for the heating elements of a cooking appliance having redundancy in the detection of errors. In this manner, there is little opportunity for uncontrolled operation of a heating element. It will be further appreciated that two relays may be placed in series rather than a relay in series with a triac as disclosed in this embodiment to achieve the same results.

Figure 7:
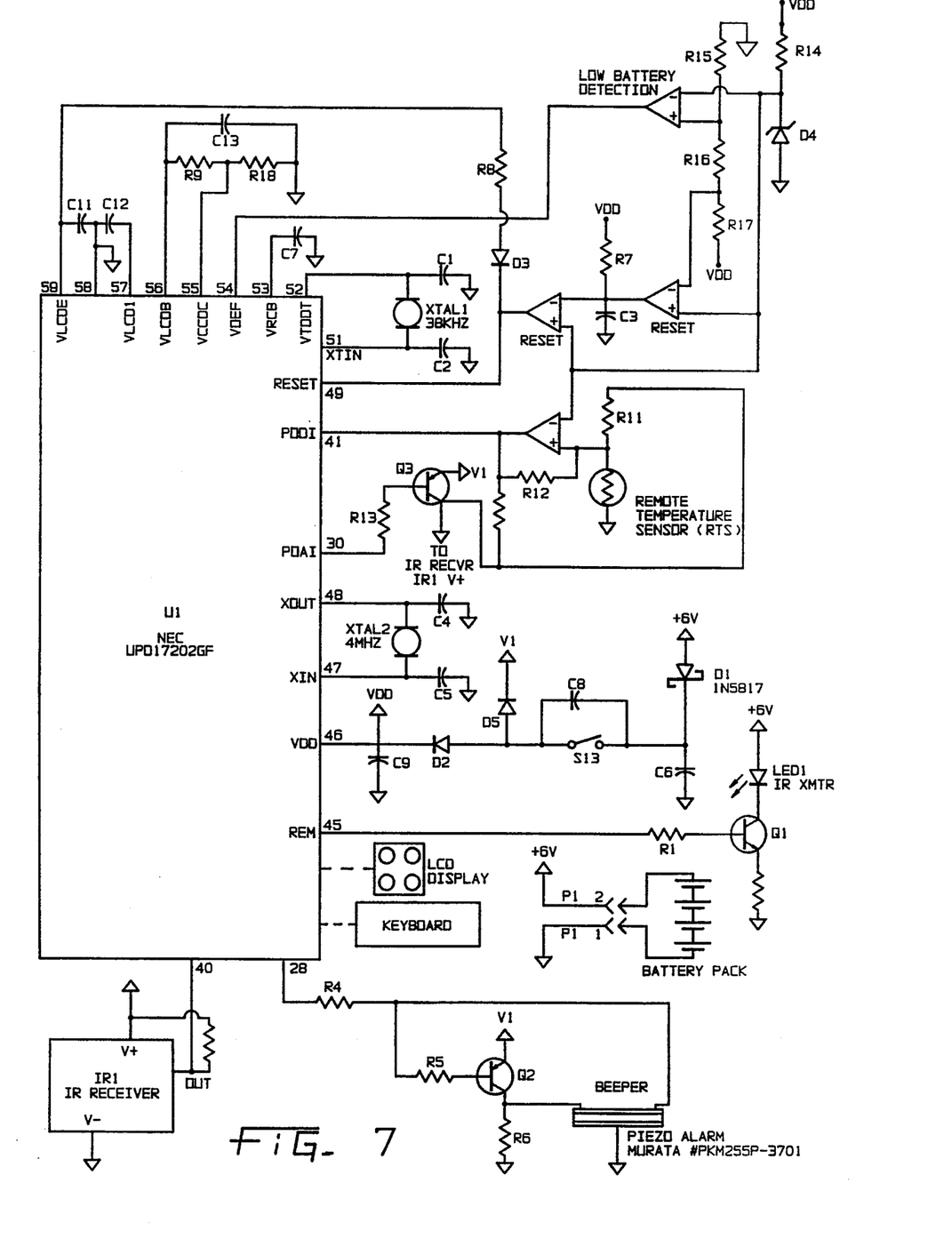
FIG. 7 is a partial schematic diagram of one embodiment of the remote control unit of the present invention.

Referring now to FIG. 7, there is shown a partial schematic diagram of one embodiment of the remote control unit of the present invention. Microprocessor U1 such as the uPD7202GF manufactured by NEC Corporation, is operatively connected to LCD Display 44 and to keyboard 42 for display of messages and power level status to the user and for acceptance of user selected operational parameters. Also, infrared receiver IR1 is connected to microprocessor U1 for receiving reply signals from the appliance control unit. A transmitter for sending signals to appliance control unit 64 from remote control unit 34 is also operatively connected to microprocessor U1. Such a transmitter is simply an infrared LED diode IR XMTR buffered with a transistor. Infrared transmitting LED diode IR XMTR should have a wide transmission pattern as the distance between remote control unit 34 and appliance control unit 64 is generally small. A pulse-modulated carrier frequency, such as that generated by XTAL1, of 38 KHZ is sufficient to drive infrared transmitter IRXMTR. Alarm BEEPER serves as an audible alarm as may sounded when the user is to be alerted of an error such as the presence of an obstruction in the communication path between remote control unit 34 and appliance control unit 64.

Remote control unit 34 also provides two sensor means for sensing a predefined environmental condition and for taking appropriate action upon the detection of such an environmental condition. One such sensor means is remote temperature sensor RTS for sensing a high temperature condition. Should remote control unit 34 be introduced into a hostile, high temperature environment, such as in proximity to the heating elements of the cooking appliance or to an appliance of an excessive temperature, such as a toaster, a warning signal may be generated by alarm BEEPER, serving as a warning means. Display 44 may also serve as a means for generating a warning signal displaying the message HI CONTROL TEMP is illustrated in FIG. 2.

Remote control unit is permanently mounted in the bracket. In use, the remote slides into a viewable position via slots in the bracket. When the remote is in the "retracted" or non-operating position, a gravity switch disconnects the battery. The "retracted" position also saves space above the countertop since in this position it hangs down only about 1" below the bottom of the kitchen cabinet. The gravity switch also allows a feature to be implemented which instantly turns off all elements as soon as the remote is pushed up into its non-operating position. This allows a convenient and quick "panic" off. Since the battery is disconnected in this position, charge stored in a capacitor is used to drive the base of the IR transmitter buffer transistor. The charge is ample to send one complete "off" transmission to the cooktop before the energy is exhausted. Thus, if three elements are on, and it is desired to turn them all off, the user just pushes the remote into its "hidden position". Without this feature, the 3 "on/off" keys corresponding to each element would need to be pressed to turn off all elements. Since at this point, all cooking has ceased, the user would most likely push the remote into its "hidden position" anyway.

Automatically shutting off the power to remote control unit 34 is desirable for two reasons. First, the life of batteries powering remote control unit 34 is extended since no power is consumed when remote control unit 34 is not in use. Second, the operation of remote control unit 34 is prevented when display 44 of remote control unit 34 is not visible or legible due to its nearly upright position.

In addition to disconnecting power from remote control unit 34 in the event of the occurrence of a predefined environmental condition such as the orientation of remote control unit 34, it is desirable to first deactivate any heating element of the cooking appliance which might be activated at the time the condition is sensed. To accomplish this objective, microprocessor U1, operatively connected to remote temperature sensor RTS and to gravity switch S13, generates an error code. The error code is transmitted via transmitter IR XMTR to second wireless communication or receiver means 66 (see FIG. 3) of appliance control unit 64. Upon receipt of a signal including such an error code, element switch means 68 deactivates whichever of first, second, third or fourth heating elements 22, 24, 26 or 28, respectively, which is activated at the time such a output signal is received. A similar action is generated when the remote control unit senses an abnormally high temperature.

It will be appreciated that other sensor means may be provided for the detection of a hostile environmental condition. For example, a sensor capable of measuring humidity may be used to avoid placement of remote control unit 34 in proximity to a humid environment as may be found near a pan of boiling liquid or near the sink in a kitchen. It will be further appreciated that various combinations of the generation of a warning signal, powering off of heating elements 22, 24, 26 and 28, and powering off of remote control unit 34 may be desirable depending on the particular environmental condition sensed and the implications or possible consequences of its detection.

It will be further appreciated by those of skill in the art that the provision of remote control unit 34 with remote temperature sensor RTS allows the manufacturer to utilize components for control of the cooking appliance that might otherwise be inadequate to withstand the heat generated by the heating elements of the cooking appliance should the controls be positioned proximate to the heating elements. This helps to reduce manufacturing costs. In addition, remote temperature sensor RTS assists in preventing damage to remote control unit 34 as the user is both audibly and visually informed of the potential problem of the introduction of remote control unit 34 being introduced into a hostile environment.

Remote control unit 34 further includes a low battery detection circuit as shown in FIG. 7. In response to battery power falling below a predefined threshold, the message BATTERY, as seen in FIG. 2, is displayed on LCD display 44. Such predefined threshold should be set to allow ample operation time before microprocessor U1 is reset so that meal preparation will not inadvertently be terminated due to a low battery condition.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A cooking appliance, comprising:
   a heating element; and
   an appliance control unit having an element switch means operatively connected to said heating element for activating and deactivating said heating element of said cooking appliance, said element switch means including:
   a first power switching device,
   a second power switching device connected in series with said first power switching device, and
   detection means for continuously detecting a failure of one of said first and second power switching devices during the time when said element switch means is set to deactivate said heating element, said detection means being operatively connected to to said first and second power switching devices, whereby the detection of a failure of one of said first and second power switching devices causes said element switch means to disable said heating element during the period of such failure.

2. The cooking appliance of claim 1 wherein said detection means comprises a resistor network.

3. The cooking appliance of claim 1 wherein said appliance control unit further comprises second processor means operatively connected to said element switch means for generating an error code in the event said detection circuit detects a failure, and a second wireless communication means operatively connected to said second processor means for transmitting an appliance error signal including said error code, said cooking appliance further comprising:
   a remote control unit adapted to be located remote from said cooking appliance, said remote control unit including
   first wireless communication means for receiving said appliance error signal, and
   warning means operatively connected to said first wireless communication means, whereby in the event said first wireless communication means receives said appliance error signal, said warning means generates a warning signal.

4. The electronic control of claim 3 wherein said warning means comprises an audible alarm.

5. The electronic control of claim 3 wherein said warning means comprises a visual display.

6. The cooking appliance of claim 1 wherein said detection means comprises means for continuously detecting a high voltage level indicative of a failure of one of said first and second power switching devices, said detection means causing said element switch means to disable said heating element during the period of such high voltage level.

7. The cooking appliance of claim 1 wherein said detection means comprises a voltage attenuator.

8. The cooking appliance of claim 1 wherein said detection means comprises a voltage divider resistor network.

9. A method for controlling a cooking appliance, said cooking appliance including a heating element and an appliance control unit, said appliance control unit having element switch means operatively connected to said heating element for activating and deactivating said heating element, said element switch means having a first power switching device, a second power switching device connected in series with said first power switching device, and detection means for detecting a failure of one of said first and second power switching devices, said detection means operatively connected to said first and second power switching devices, said method comprising the steps of:

continuously detecting a failure of one of said first and second power switching devices when said element switch means is set to deactivate said heating element; and disabling said heating element.

10. The method of claim 6 wherein said appliance control unit further comprises second processor means operatively connected to said element switch means for generating an error code in the event said detection circuit detects a failure, second wireless communication means operatively connected to said second processor means for transmitting an appliance error signal including said error code, and wherein said cooking appliance further comprises a remote control unit adapted to be located remote from said cooking appliance, said remote control unit including first wireless communication means for receiving said appliance error signal and warning means operatively connected to said first wireless communication means, said method further comprising the steps of:

generating said error code;

transmitting said appliance error signal including said error code with said second wireless communication means;

receiving said appliance error signal with said first wireless communication means; and generating a warning signal upon the occurrence of said failure of one of said first and second power switching devices.

11. An element switch means for activating and deactivating a heating element of a cooking appliance, said element switch means comprising:

a first power switching device, a second power switching device connected in series with said first power switching device, and detection means for continuously detecting a failure of one of said first and second power switching devices during the time when said element switch means is set to deactivate said heating element, said detection means being operatively connected to said first and second power switching devices, whereby the detection of a failure of one of said first and second power switching devices causes said element switch means to disable said heating element during the period of such failure.

12. The element switch means of claim 11 wherein said detection means comprises means for continuously detecting a high voltage level indicative of a failure of one of said first and second power switching devices, said detection means causing said element switch means to disable said heating element during the period of such high voltage level.

13. The element switch means of claim 11 wherein said detection means comprises a voltage divider resistor network.

14. The element switch means of claim 11 wherein further comprising second processor means for generating an error code in the event said detection circuit detects a failure;

a second wireless communication means operatively connected to said second processor means for transmitting an appliance error signal including said error code;

a remote control unit adapted to be located remote from said cooking appliance, said remote control unit including first wireless communication means for receiving said appliance error signal, and warning means operatively connected to said first wireless communication means, whereby in the event said first wireless communication means receives said appliance error signal, said warning means generates a warning signal.

15. The element switch means of claim 14 wherein said warning means comprises an audible alarm.

16. The element switch means of claim 15 wherein said warning means comprises a visual display.

* * * * *